US 6,740,901 B2

(12) United States Patent
Miki et al.

(10) Patent No.: US 6,740,901 B2
(45) Date of Patent: May 25, 2004

(54) PRODUCTION OF SEMICONDUCTOR INTEGRATED CIRCUIT

(75) Inventors: Hiroshi Miki, Tokyo (JP); Yasuhiro Shimamoto, Hachioji (JP); Masahiko Hiratani, Akishima (JP); Tomoyuki Hamada, Chiba (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/307,354

(22) Filed: Dec. 2, 2002

(65) Prior Publication Data
US 2003/0129806 A1 Jul. 10, 2003

Related U.S. Application Data

(62) Division of application No. 09/877,207, filed on Jun. 11, 2001, now Pat. No. 6,509,246.

(30) Foreign Application Priority Data

Oct. 17, 2000 (JP) ........................................ 2000-321919

(51) Int. Cl.[7] .............................................. H01L 27/108
(52) U.S. Cl. .................... 257/68; 257/301; 257/532; 257/534; 438/287; 438/396; 438/398
(58) Field of Search ......................... 257/68, 301, 532, 257/534, 66, 71; 438/287, 396, 398, 260, 397

(56) References Cited

U.S. PATENT DOCUMENTS

| 5,352,623 | A | 10/1994 | Kamiyama |
| 6,057,189 | A | 5/2000 | Huang et al. |
| 6,103,567 | A | 8/2000 | Shih et al. |
| 6,218,260 | B1 * | 4/2001 | Lee et al. ................... 438/398 |
| 6,387,761 | B1 * | 5/2002 | Shih et al. .................. 438/287 |
| 6,403,444 | B2 * | 6/2002 | Fukuzumi et al. ......... 438/396 |
| 6,448,146 | B1 * | 9/2002 | Lee et al. ................... 438/398 |
| 6,583,441 | B2 * | 6/2003 | Moradi et al. ............... 257/68 |

FOREIGN PATENT DOCUMENTS

| JP | 4-223366 | 12/1990 |
| JP | 6-244364 | 2/1993 |
| JP | 11-26712 | 6/1997 |
| JP | 11-191612 | 12/1997 |

* cited by examiner

Primary Examiner—David Nelms
Assistant Examiner—Dao H. Nguyen
(74) Attorney, Agent, or Firm—Reed Smith LLP; Stanley P. Fisher, Esq.; Juan Carlos A. Marquez, Esq.

(57) ABSTRACT

A semiconductor integrated circuit in which the storage capacitor has an increased capacitance and a decreased leakage current. The storage capacitor is formed by the steps of: forming a polysilicon bottom electrode having semi-spherical silicon crystals formed thereon; performing plasma nitriding on the surface of said bottom electrode at a temperature lower than 550° C., thereby forming a film of silicon nitride having a film thickness smaller than 1.5 nm; and depositing a film of amorphous tantalum pentoxide and then crystallizing said amorphous tantalum pentoxide. The silicon nitride film has improved resistance to oxidation and also has a reduced leakage current. As a result, the polysilicon bottom electrode becomes resistant to oxidation and the storage capacitor increases in capacitance and decreases in leakage current.

10 Claims, 7 Drawing Sheets

SiN thickness (as-nitrided) (nm)

Effective Dielectric Constant

PRODUCTION OF SEMICONDUCTOR INTEGRATED CIRCUIT

CROSS REFERENCE TO RELATED APPLICATIONS

This application claims priority under 35 U.S.C. § 119(d) to Japanese Patent Application No. P200321919 filed on Oct. 17. 2000. This application is a Divisional of a non-provisional patent application under 35 U.S.C. § 120 of U.S. patent application Ser. No. 09/877,207 filed on Jun. 11, 2001, now U.S. Pat. No. 6,509,246.

BACKGROUND OF THE INVENTION

1. Field of the Invention

The present invention relates to a semiconductor integrated circuit and a process for production thereof. More particularly, the present invention relates to a technology to be applied to a semiconductor integrated circuit having DRAM (Dynamic Random Access Memory).

2. Description of the Background

DRAM is composed of memory cells, each consisting of a memory cell transistor and a storage capacitor connected thereto, which are arranged in an array on a semiconductor substrate. For DRAM to have a high capacity, the memory cell should have a high capacitance per unit area.

One way to meet this requirement is to make the dielectric film of the capacitor from tantalum pentoxide having a high dielectric constant, as disclosed in Japanese Patent Laid-open No. 244364/1994. The feature of this disclosure is that the polysilicon electrode is coated with silicon nitride film by thermal nitriding with ammonia so that the polysilicon electrode is not oxidized when the tantalum pentoxide film undergoes heat treatment with oxygen.

A similar technology is disclosed in Japanese Patent Laid-open No. 26712/1999, according to which the capacitor is constructed of polysilicon electrodes (which have semispherical silicon crystals formed on the surface thereof) and tantalum pentoxide film by thermal nitriding. This technology is effective in increasing capacitance per unit area owing to the high dielectric constant of tantalum pentoxide and the increase in the effective electrode surface area achieved by the semispherical silicon crystals.

Additionally, Japanese Patent Laid-open No. 223366/1992 discloses another method of forming silicon nitride film on the surface of polysilicon by plasma nitriding.

SUMMARY OF THE INVENTION

The present invention may be applicable to the process of forming DRAM capacitors to be used for high-capacity semiconductor circuits such as 256 Mbit DRAMs. The process for production of such large-capacity DRAMs proceeds in a way in which the transistors for sense amplifier are already formed when the capacitor step starts. Therefore, these transistors may deteriorate, causing irregular operation, if the capacitor step is carried out at, say, 900° C. Previous attempts to address this problem by carrying out nitriding at 800° C. failed because the silicon nitride film is oxidized while tantalum pentoxide undergoes heat treatment for crystallization (at 750° C. in oxygen), with the result that the capacitor decreases in capacitance.

The crystallization of tantalum pentoxide needs heating at 700° C. and preferably at a temperature of 750° C. or above. Crystallization should cause tantalum pentoxide to change from an amorphous structure (having a dielectric constant of 25) into a δ-phase crystalline structure (having a dielectric constant of 60); however, according to the conventional technology, crystallization takes place almost simultaneously with the oxidation of the silicon nitride film. Therefore, the effect of increasing the capacitance per unit area by increasing the dielectric constant is cancelled by a decrease in capacitance due to oxidation of the silicon nitride film. Thus the conventional technology has heretofore not made effective use of the high dielectric constant of tantalum pentoxide.

The process of forming semispherical silicon crystals on the surface of a polysilicon electrode is usually followed by an additional step of doping the surface of the silicon crystals with phosphorus, thereby decreasing the voltage dependence of the capacitance of the capacitor. Plasma nitriding at 800° C. caused the doped phosphorus to vaporize again, with the result that the voltage dependence of capacitance increased, and the capacitance of the capacitor substantially decreased.

It is an object of the present invention to produce semiconductor integrated circuits at a relatively low temperature and produce capacitors having a sufficiently large capacitance per unit area, for example, for high capacity DRAMs.

The above and other objects, features, and advantages of the present invention will become readily apparent from the following detailed description which is to be read in connection with the accompanying drawings, abstract, and attached claims. One or more embodiments of the present invention preferably address one or more of these objects and/or features.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

The semiconductor integrated circuit according to one embodiment of the present invention is characterized in that the bottom electrode consists of polysilicon film and semispherical silicon crystals formed on the surface thereof and the capacitor is a dielectric film of double-layer structure consisting of silicon nitride film and tantalum pentoxide film, the former being formed by directly nitriding the surface of the bottom electrode at a temperature below 700° C.

The semiconductor integrated circuit according to another embodiment of the present invention is characterized in that the bottom electrode consists of polysilicon film and semispherical silicon crystals formed on the surface thereof and the capacitor is a dielectric film of double-layer structure consisting of silicon nitride film and tantalum pentoxide film, the former being formed by plasma nitriding.

The semiconductor integrated circuit according to another embodiment of the present invention is characterized in that the bottom electrode is a polysilicon film doped with phosphorus and the capacitor is a dielectric film of double-layer structure consisting of silicon nitride film and tantalum pentoxide film, the former being formed by directly nitriding the surface of the bottom electrode at a temperature below 700° C.

The semiconductor integrated circuit according to another embodiment of the present invention is characterized in that the bottom electrode is a polysilicon film doped with phosphorus and the capacitor is a dielectric film of double-layer structure consisting of silicon nitride film and tantalum pentoxide film, the former being formed by plasma nitriding.

<First Exemplary Embodiment>

Figure 3:
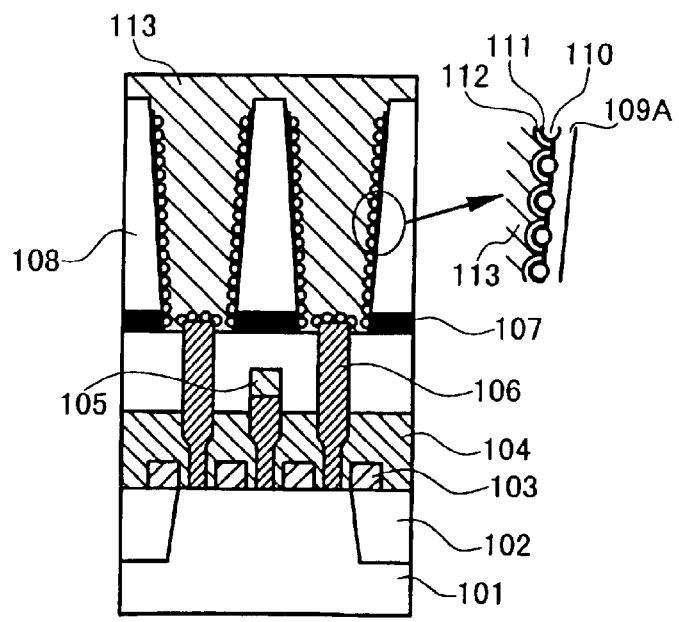
FIG. 3 is a schematic sectional view showing the structure of the memory cell of DRAM prepared in Example 1.
Figure 4:
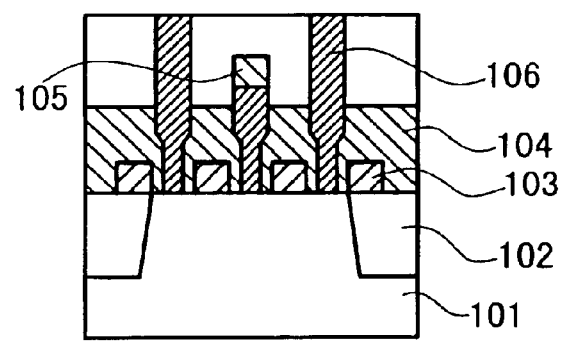
FIG. 4 is a schematic sectional view showing a step of producing the memory cell of DRAM in Example 1.
Figure 5:
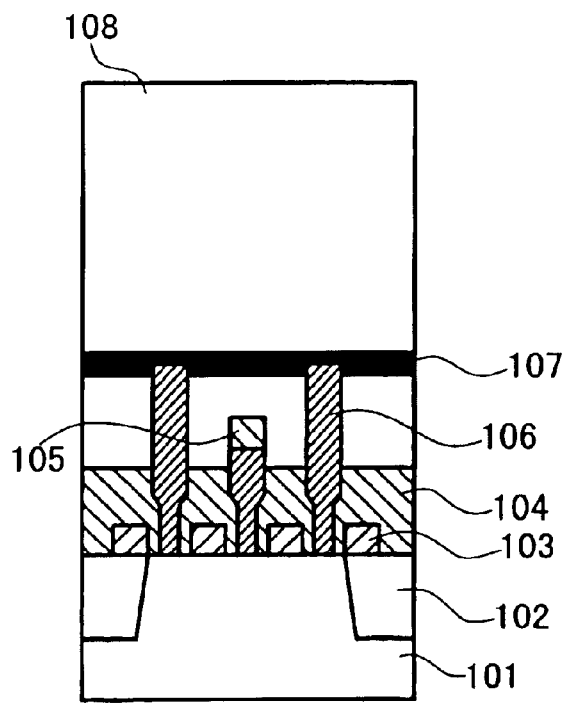
FIG. 5 is a schematic sectional view showing a step of producing the memory cell of DRAM in Example 1.
Figure 6:
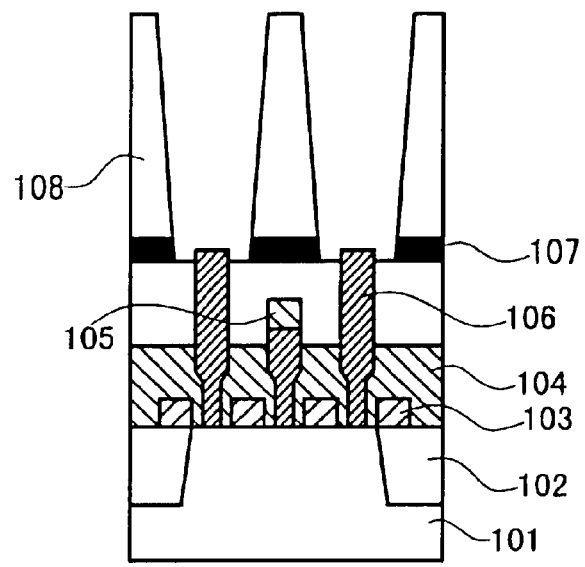
FIG. 6 is a schematic sectional view showing a step of producing the memory cell of DRAM in Example 1.
Figure 7:
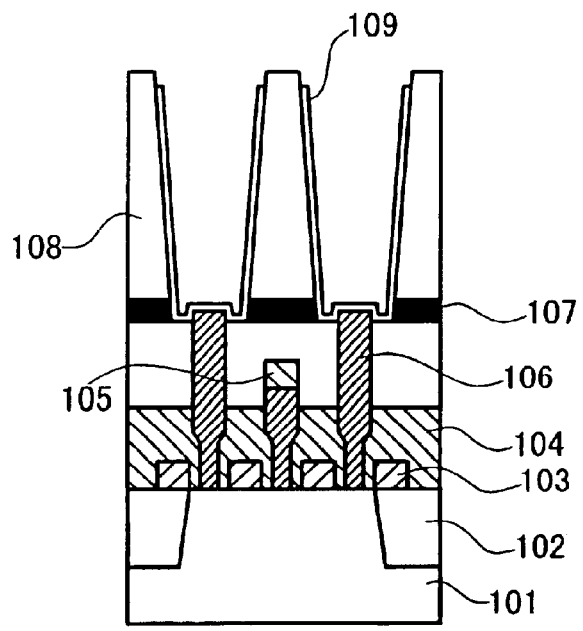
FIG. 7 is a schematic sectional view showing a step of producing the memory cell of DRAM in Example 1.
Figure 8:
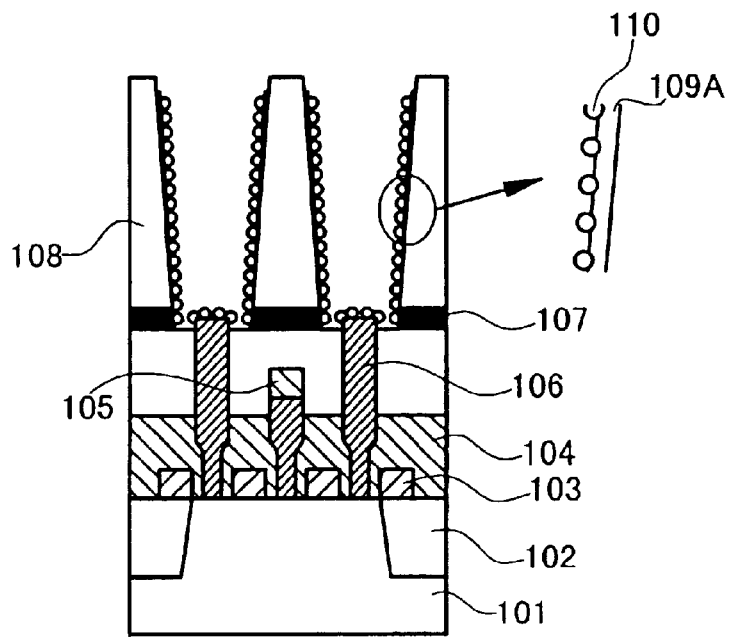
FIG. 8 is a schematic sectional view showing a step of producing the memory cell of DRAM in Example 1.
Figure 9:
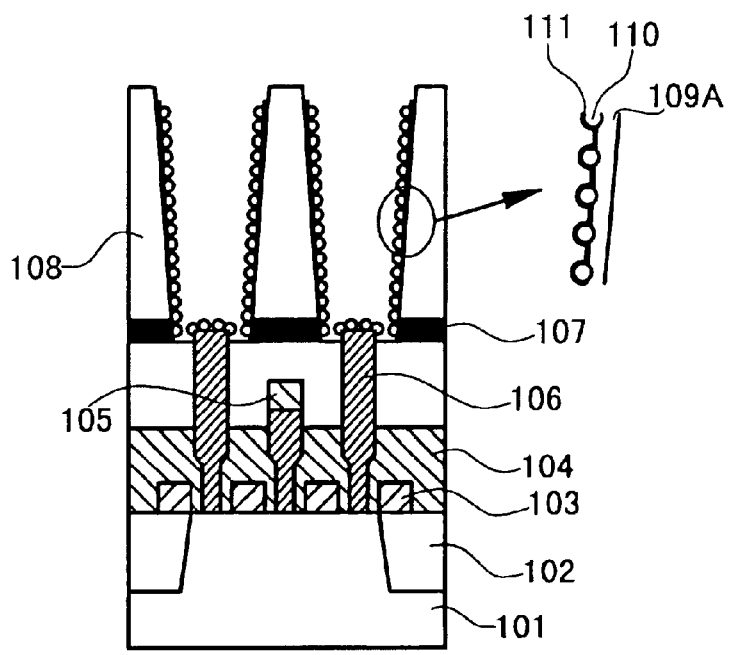
FIG. 9 is a schematic sectional view showing a step:of producing the memory cell of DRAM in Example 1.
Figure 10:
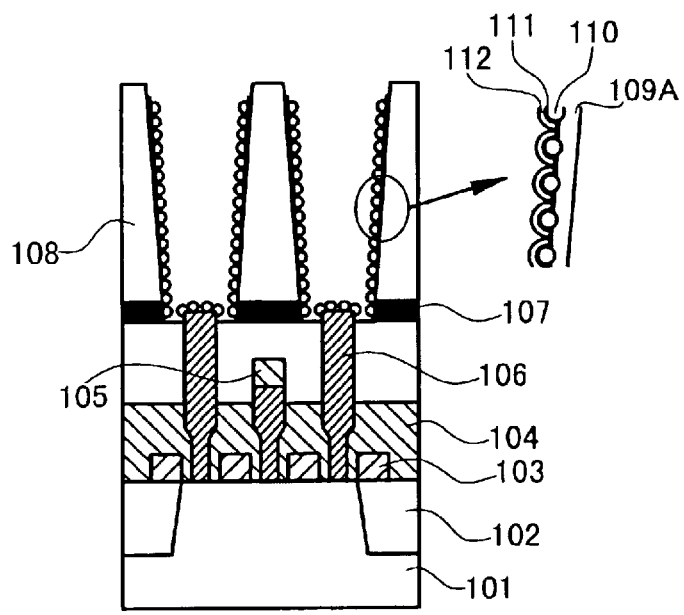
FIG. 10 is a schematic sectional view showing a step-of producing the memory cell of DRAM in Example 1.

The DRAM memory cell capacitor having a capacitor according to the present invention is shown in section in FIG. 3. Its production process is described below with reference to FIGS. 4 to 10.

First, a memory cell transistor is formed by the known process (e.g., preparing Si substrate 101, isolation by $SiO_2$ 102, transistor gate 103, and interlayer dielectrics 104). On the memory cell transistor are formed the bit line 105 and the polysilicon plug 106 which electrically connects the memory cell transistor to the capacitor (see FIG. 4).

Subsequently, the silicon nitride film 107 (about 100 nm thick) is formed by a CVD method. The silicon nitride film 107 functions as an etching stopper for the silicon oxide film 108 to separate the bottom electrode of the capacitor in a later process step. On the silicon nitride film 107 is formed the silicon oxide film 108 (approximately 2 μm thick) from tetraethoxysilane (TEOS) by a CVD method (see FIG. 5).

The silicon oxide film 108 and the silicon nitride film 107 undergo dry etching through a photoresist mask. In this way the trench for the bottom electrode is formed on the polysilicon plug 106 (see FIG. 6).

The phosphorus-doped amorphous silicon film 109 (approximately 35 nm thick) is formed. Subsequently, it is separated for individual bits by a known etch-back technique that employs a photoresist (see FIG. 7).

After cleaning, the surface of the amorphous silicon film 109 undergoes the nucleating treatment. Thereafter it undergoes crystallization so that semispherical silicon crystals 110 are formed (see FIG. 8).

The surface of the semispherical silicon crystals 110 is preferably doped with phosphorus (in the form of phosphine, for example). In this way the bottom electrode may be constructed. It should be noted that this additional phosphorus doping is preferred because, when the semispherical silicon crystals 110 are formed, the phosphorus concentration on the surface of the crystals decreases, which leads to depletion in polysilicon under the influence of an electric field and a decrease in capacitance.

A silicon nitride film 111 is preferably formed on the surface of the bottom electrode by plasma nitriding with plasma in nitrogen. This step may be accomplished with the aid of a plasma apparatus having parallel plate electrodes. The principle of plasma nitriding is that active nitrogen evolved by plasma directly oxidizes silicon atoms in the surface of polysilicon, thereby forming silicon nitride film. In this exemplary embodiment, nitriding is performed at 400° C. for 1 minute with a high-frequency power of 100W. The resulting silicon nitride film 111 is about 1.5 nm thick (see FIG. 9).

Thereafter, an amorphous tantalum pentoxide film (approximately 8 nm thick) is formed by the CVD method from pentaethoxy tantalum, with the substrate being kept at 450° C. This CVD process is followed by heat treatment in oxygen at 80° C. for 5 minutes. This heat treatment changes the amorphous tantalum pentoxide film into the crystalline δ-phase tantalum pentoxide film 112 (see FIG. 10).

The upper electrode is preferably formed by depositing the titanium nitride film 113 (FIG. 3) by the reduced-pressure CVD method that employs titanium tetrachloride and ammonia. Its thickness is selected so as to fill the trench between the bottom electrode and the dielectric film, thereby planarizing (i.e., flattening) the surface irregularities due to the trench of the bottom electrode. In this way there is obtained the structure shown in FIG. 3. If necessary, the film thickness may be increased by sputtering so that the resistance of the upper electrode decreases. The step of forming the electrode may be followed by heat treatment at about 500° C. so as to remove residual chlorine from titanium nitride formed by CVD.

The upper electrode undergoes dry etching through a photoresist mask, so that titanium nitride is removed except for those parts corresponding to memory cells. Finally, wiring is carried out by the known process. Thus the desired semiconductor integrated circuit is completed.

Figure 1:
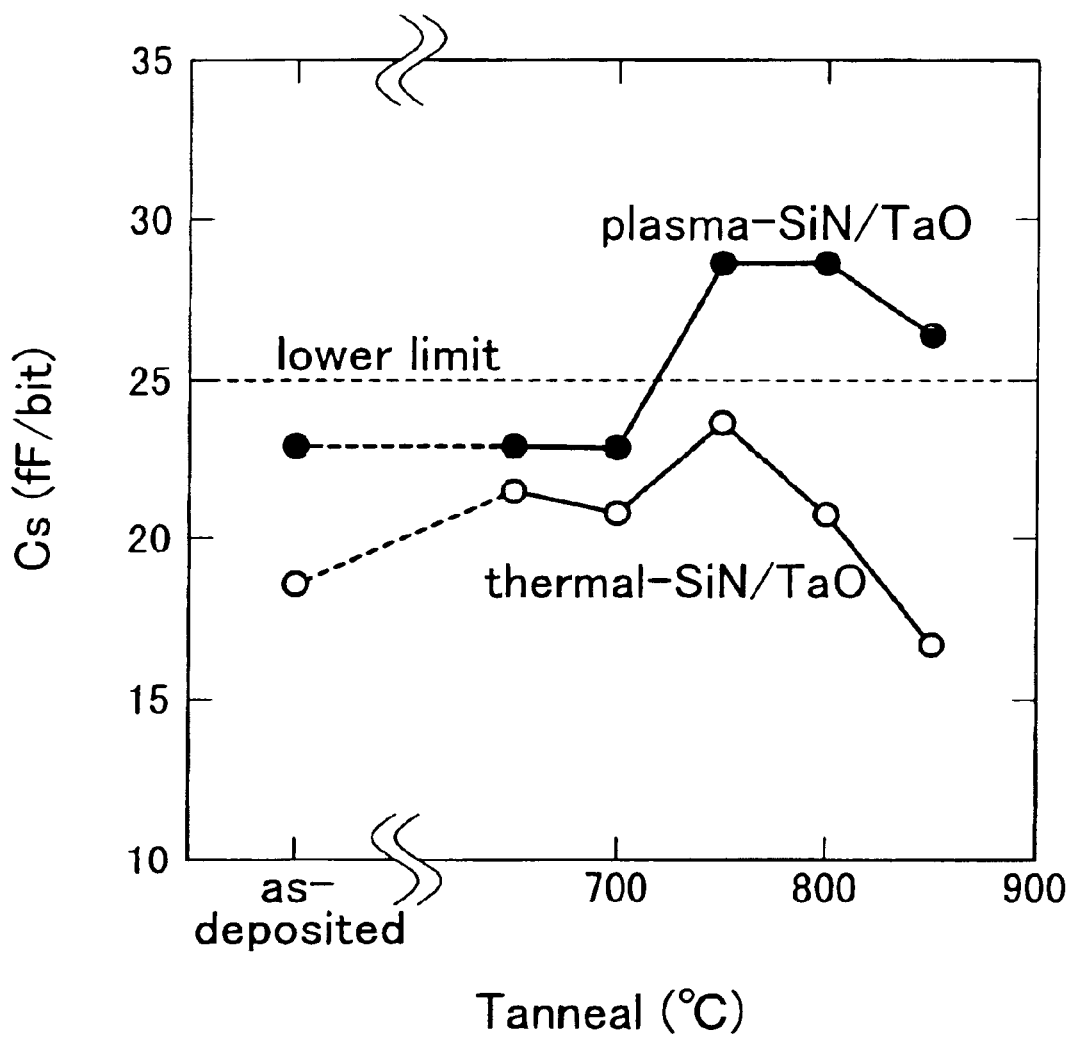
FIG. 1 is a graph showing how the temperature of heat treatment (in oxygen) of tantalum pentoxide affects the capacitance of the capacitor prepared in Example 1 and the capacitance of the capacitor prepared by thermal nitriding according to the conventional technology.
Figure 2:
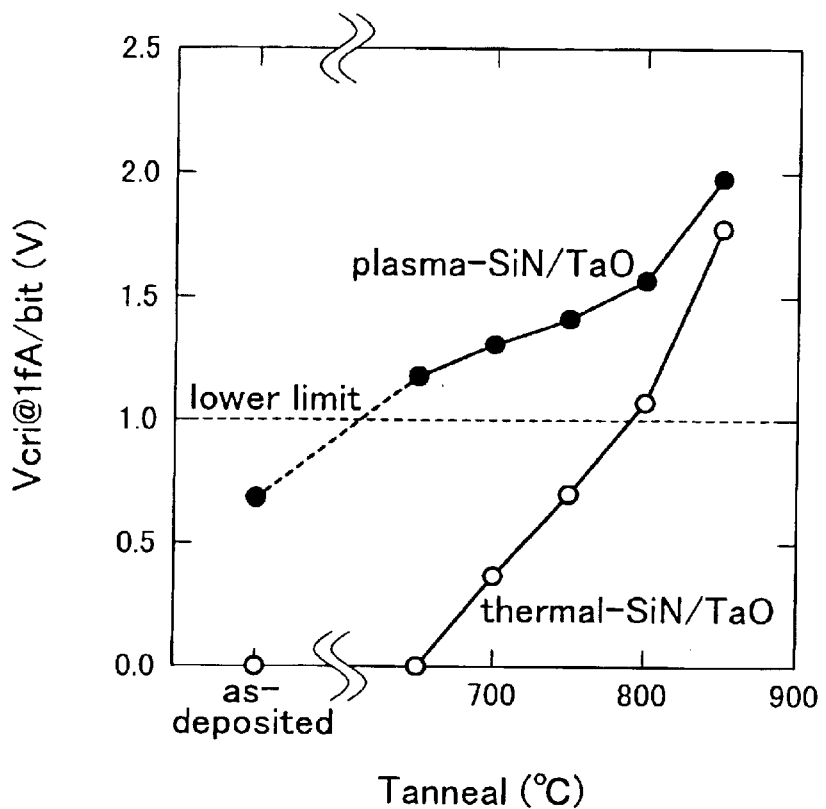
FIG. 2 is a graph showing how the temperature of heat treatment (in oxygen) of tantalum pentoxide affects the voltage at which the leakage current is 1 fA/bit in the capacitor prepared in Example 1 and in the capacitor prepared by thermal nitriding according to the conventional technology.

The plasma nitriding according to the present invention preferably produces the following effect which is explained with reference to FIGS. 1 and 2. In FIG. 1, the ordinate represents the capacitance of the capacitor per bit, and the abscissa represents the temperature at which tantalum pentoxide undergoes heat treatment in oxygen. In FIG. 2, the ordinate represents the breakdown voltage which is defined as the voltage at which the leakage current per bit is 1 fA, and the abscissa represents the heat treatment temperature as in the case of FIG. 1.

The conventional technology of forming silicon nitride film by thermal nitriding has the disadvantage that the capacitance gradually increases in proportion to the heat treatment temperature but decreases as the heat treatment temperature exceeds 750° C. at which temperature crystallization takes place. This occurs because oxidation of silicon nitride film also takes place actively at a temperature higher than 750° C. Such oxidation is effective in increasing the breakdown voltage of the capacitor. In fact, the breakdown voltage steeply increases as the temperature exceeds 700° C. as shown in FIG. 2. However, as easily inferred from the mechanism involved, the increase in breakdown voltage is accompanied by a decrease in capacitance. Therefore, with the conventional technology, it was impossible to attain both high capacitance and high breakdown voltage necessary for the high-capacity DRAM as in this exemplary embodiment.

On the other hand, it was found that the silicon nitride film formed by plasma nitriding in this embodiment has two distinct features unlike the conventional thermally formed silicon nitride film. First, plasma nitride film is better (in terms of the temperature at which oxidation under normal pressure takes place) than the conventional thermal nitride film by about 100° C. Second, plasma nitride film has less leakage current than thermal nitride film when the nitride film is formed from silicon which is highly doped with phosphorus. This will be described with reference to FIGS. 1 and 2.

As the amorphous tantalum pentoxide film crystallizes at 750° C., it increases in dielectric constant from 25 to 60 and the capacitance per bit increases to 25 fF or more accordingly (see FIG. 1). This occurs because the silicon nitride film formed by plasma nitriding hardly oxidizes at the temperature at which tantalum pentoxide crystallizes, and hence the increase in dielectric constant of the tantalum pentoxide film directly contributes to the increase in capacitance. When the heat treatment temperature is raised to 800° C., the capacitance remains substantially unchanged. However, when the heat treatment temperature exceeds about 850° C., the capacitance gradually decreases. This phenomenon is due to the fact that the thermal nitride film begins to oxidize at about 700° C. whereas the plasma nitride film remains unoxidized up to 800° C.

On the other hand, as far as breakdown voltage is concerned, the conventional thermal nitride film is inferior to the plasma nitride film. The thermal nitride film acquires its high breakdown voltage only after it has been oxidized, whereas the plasma nitride film originally has a high breakdown voltage even though it is not yet oxidized. The leakage current of the tantalum pentoxide capacitor is governed by the probability that electrons are injected into the tantalum pentoxide from the polysilicon electrode. The probability is determined by how the silicon nitride film (formed on the surface of the polysilicon electrode) functions as a barrier against electrons. FIG. 2 indicates that the plasma nitride film per se functions satisfactorily as a barrier against electrons even though it is not fully oxidized. This is an advantage over the conventional thermal nitride film which does not function as a barrier unless it is oxidized. This is the reason why it is possible to obtain sufficient capacitance and breakdown voltage necessary for high-capacity DRAM at a heat-treatment temperature (e.g., 750–800° C.) which is adequate for tantalum pentoxide to oxidize and for silicon nitride film to remain unoxidized.

In an experiment with a pattern of planar structure, it was possible to attain a capacitance per unit area as high as 25 $fF/\mu m^2$ and a leakage current (at 1 V) as low as $2\times10^{-8}$ $A/cm^2$. (Capacitance in FIG. 1 is expressed in terms of capacitance per bit.) This result is ascribed to the small effective film thickness which has heretofore not been achieved as the storage capacitor for semiconductor integrated circuits having a polysilicon electrode and a dielectric of tantalum pentoxide. This result would not be achieved by conventional thermal nitriding.

The sample without semispherical silicon crystals was found to have a capacity of 12 $fF/\mu m^2$ and a leakage current (at 1 V) lower than $1\times10^{-8}$ $A/cm^2$. It was inferred from this result that the semispherical silicon crystals produce the effect of approximately doubling the effective electrode area. Although additional phosphorus doping is not carried out in the case where semispherical silicon crystals are not formed, the nitride film formed at a low temperature according to the present invention prevents phosphorus from being caught by the nitride film. This leads to reduction in leakage current.

It should be noted that the fact that plasma nitride film is resistant to oxidation does not mean that it is not oxidized at all although it is more resistant to oxidation than the conventional thermal nitride film. For example, when the tantalum pentoxide is crystallized at 800° C., the silicon nitride film is oxidized up to a little less than 0.2 nm. Therefore, it was found that the plasma nitride film formed in this example had eventually turned into a nitride film containing oxygen near the interface of tantalum pentoxide.

<Second Exemplary Embodiment>

This example demonstrates how the silicon nitride film varies in properties depending on the plasma nitriding temperature. The plasma nitriding in the previous exemplary embodiment was carried out at 400° C. with 100 W for 1 minute.

Figure 11:
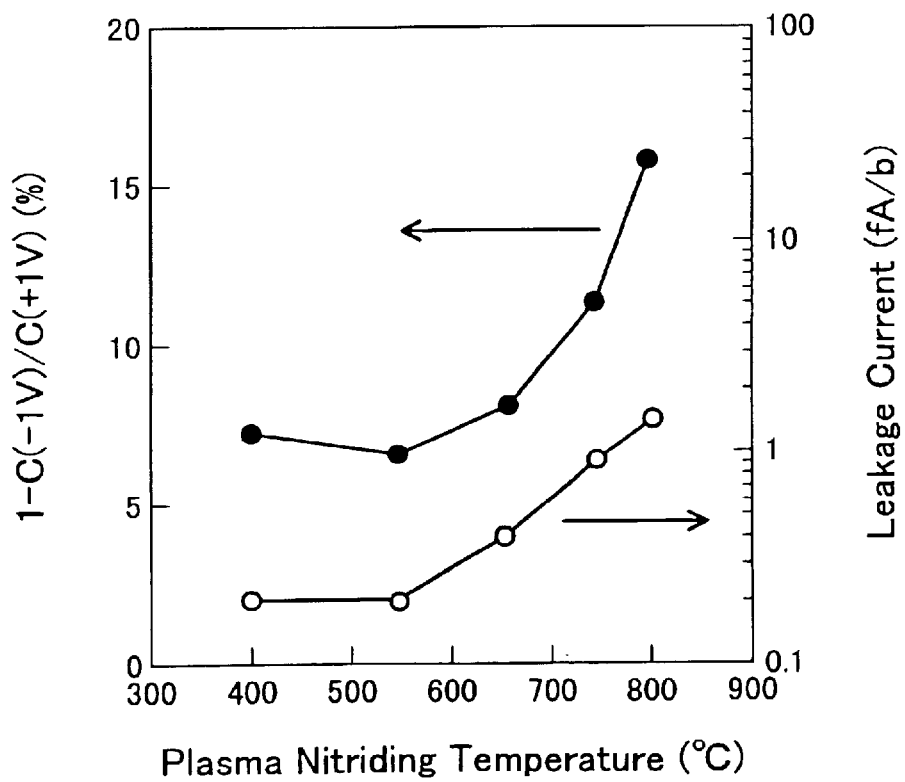
FIG. 11 is a graph showing the effect of temperature of plasma nitriding in Example 2.

FIG. 11 shows the relation between the nitriding temperature and the voltage dependence of capacitance and the relation between the nitriding temperature and the leakage current. It is noted that both the voltage dependence and the leakage current rapidly increase as the nitriding temperature exceeds about 700° C. This suggests that the beneficial performance of plasma nitriding mentioned in the first example is due to the fact that the silicon nitride film can be formed at a low temperature. The increase in voltage dependence indicates that the concentration of phosphorus decreases in the vicinity of the interface of the silicon nitride film. The fact that the capacitor formed at a high temperature increases in leakage current as in the case of voltage dependence suggests that the nitride film catches phosphorus (decreasing the surface concentration of phosphorus) and becomes weak in its function as a barrier against electrons. It is expected from the foregoing that the process that permits the nitriding of silicon at a low temperature will produce the same effect as in the first example.

Other methods of forming nitride film at a low temperature for use with the present invention are described below. One such method employs the source of nitriding supplied from the radical generating apparatus. This method is very slow in forming the nitride film, taking more than 30 minutes. However, it produces the same effect as in the first example. Another method employs the source of nitriding obtained from remote plasma. This method is also slow but gives rise to a nitride film having high oxidation resistance and high breakdown voltage. However, it was confirmed that the effect of the present invention is obtained by any method capable of nitriding at a low temperature. It is inferred from FIG. 11 that the nitriding temperature should be lower than 700° C., preferably lower than 550° C.

It is known that thermal nitriding with ammonia hardly occurs at such a temperature and hence it is not applicable. In other words, it is impossible to obtain the effect of the present invention simply by lowering the temperature in the conventional technology. Also, reduced-pressure CVD requires a reaction temperature higher than about 700° C. to form the nitride film. Hence it is impossible to produce the effect of the present invention by reduced-pressure CVD.

Reactions at a low temperature produce a noticeable effect in the case where the surface of the polysilicon film contains phosphorus in high concentration, as apparent from the above-mentioned mechanism. As mentioned in the first exemplary embodiment, in the case where semispherical silicon crystals are formed, it is preferred to supplement phosphorus in the form of phosphine from the gas phase. As a result, the surface contains phosphorus in high concentration as a matter of course. Therefore, it is apparent that the present invention may be effective in increasing the capacitance of DRAM capacitor by means of semispherical silicon crystals.

<Third Exemplary Embodiment>

Figure 12:
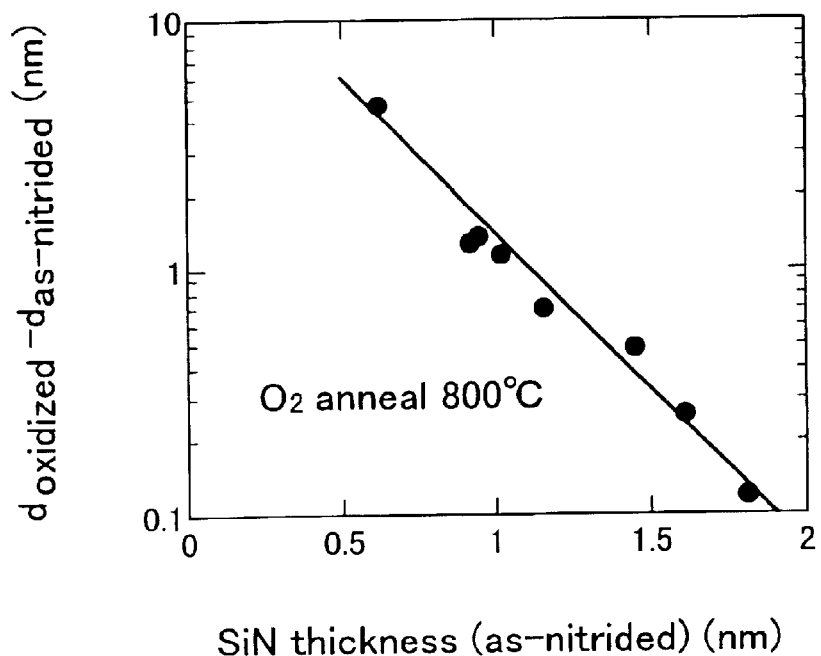
FIG. 12 is a graph showing how the film formed by plasma nitriding in Example 3 varies in resistance to oxidation depending on its thickness.

This example demonstrates how the thickness of the plasma nitride film affects resistance to oxidation. In view of the fact that the film thickness depends mainly on electric input power and little on duration, the effect of film thickness on resistance to oxidation is investigated by changing the amount of electric power supplied. The results are shown in FIG. 12, the abscissa representing the thickness of the nitride film and the ordinate representing the increase in film thickness that results from oxidation at 800° C. for 5 minutes.

It is noted that nitride film thinner than 1 nm may be poor in resistance to oxidation. This suggests that the nitride film should be thicker than 1 nm, preferably thicker than 1.5 nm. Also, there necessarily exists an upper limit to the film thickness in consideration of practical capacitance because the capacitor decreases in capacitance as the film becomes excessively thick.

Also, the results of investigation on the reactant gas showed no significant difference among pure nitrogen, ammonia, and hydrogen-containing nitrogen so long as the reaction temperature is lower than 550° C. because resistance to oxidation is determined mainly by the reaction temperature as mentioned above.

<Fourth Exemplary Embodiment>

This example demonstrates how the method of heat treatment affects the tantalum pentoxide thin film. It is known from the results in the first embodiment that the effect of heat treatment does not depend on temperature. The heat treatment in the first example, which was carried out in oxygen at 800° C. for 5 minutes, gave better results (in capacitance per unit area and breakdown voltage) than the conventional heat treatment, as shown in FIGS. 1 and 2, regardless of the heat treatment temperature. The present invention can be favorably applied to the technology involving silicide or the like which needs a strictly controlled heat history. On the assumption of a maximum process temperature of 650° C., the technology of the present invention can afford a capacitance per bit higher than 23 fF and a breakdown voltage higher than 1 V. The possibility that the capacitance will be smaller than that in the case of high-temperature treatment may be avoided by increasing the height of the bottom electrode structure, thereby securing the capacitance required.

In the first example, oxygen was used as the atmosphere for heat treatment; however, oxygen may be replaced by any other oxidizing gas such as diluted oxygen, ozone, and nitrous oxide. Moreover, plasma oxygen treatment or oxygen radical treatment will also produce the above-mentioned effect of improving the silicon nitride film in oxidation resistance and reducing the leakage current.

<Fifth Exemplary Embodiment>

This example shows the result of investigation on the crystallization of tantalum pentoxide mentioned in the first embodiment. Crystals of tantalum pentoxide usually take on a long-period crystal structure called L-phase. The film of tantalum pentoxide in the present invention may be too thin for the long period to exist stably. Instead, tantalum pentoxide of short-period symmetrical hexagonal δ-phase is relatively stable. This δ-phase has a dielectric constant as high as about 60. Moreover, as compared with the L-phase, the δ-phase is higher in the lowest energy of conduction band by about 0.5 eV. Therefore, this crystal structure tends to prevent the injection of electrons from the electrode (such as polysilicon or titanium nitride). These two features are favorable to the semiconductor integrated circuit. They make it possible to form a capacitor with a large capacitance in a limited area and to reduce the leakage current.

Figure 13:
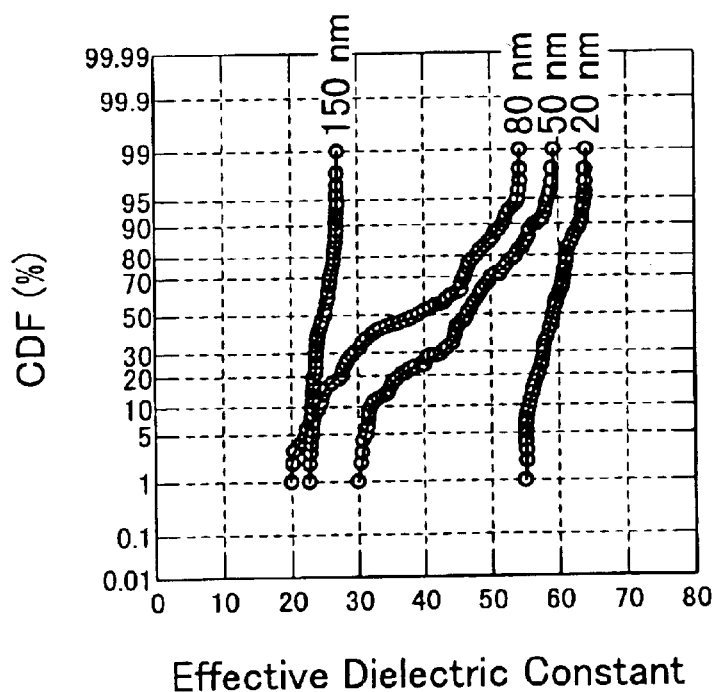
FIG. 13 is a graph showing how the film of tantalum pentoxide in Example 5 varies in performance depending on its thickness.

FIG. 13 shows the cumulative distribution of dielectric constant of tantalum pentoxide crystallized at 750° C. It is apparent that the 20-nm thick film has a stable, high dielectric constant, although the threshold film thickness for the δ-phase to be stable is not known definitely. It was also found that the leakage current density decreases as the film thickness decreases (and it reaches a practically acceptable value when the film thickness is 20 nm), although the threshold film thickness for the leakage current density is not known definitely. These findings suggest that the film thickness should be smaller than 20 nm so that tantalum pentoxide in δ-phase is industrially utilized by virtue of its high dielectric constant and low leakage current.

For tantalum pentoxide in δ-phase to be applied to the capacitor of a DRAM, it should have good oxidation resistance so that the underlying silicon nitride film is not oxidized (with an increase in film thickness) when it is crystallized, as mentioned in the first example. Moreover, tantalum pentoxide in δ-phase can be applied to the gate insulating film of a field effect transistor by virtue of its high dielectric constant and low leakage current. It can also be applied to the interlayer insulating film of flash memory. Tantalum pentoxide in L-phase applied to these applications is not satisfactory in yields and reliability; however, tantalum pentoxide in δ-phase in the form of thin film is stable and exhibits high performance for industrial use.

The present invention makes it possible to form minute capacitors each having a sufficient capacitance, and hence the present invention provides high-capacity semiconductor integrated circuits, particularly DRAM.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor integrated circuit including a plurality of capacitive elements, each element comprised of:
   a bottom electrode of polysilicon having semispherical silicon crystals formed thereon; and
   a dielectric film of laminate structure comprised of a first dielectric whose principal component is silicon nitride and a second dielectric whose principal component is tantalum pentoxide, wherein said first dielectric is a silicon nitride film which is formed by direct nitriding of a surface of said semispherical silicon crystals and said tantalum pentoxide is a hexagonal δ-phase crystalline.

2. The semiconductor integrated circuit as defined in claim 1, wherein the first dielectric has a film thickness larger than 1 nm.

3. The semiconductor integrated circuit as defined in claim 1, wherein the second dielectric is crystallized and the crystal has a dielectric constant higher than 50.

4. The semiconductor integrated circuit as defined in claim 1, wherein each capacitive element is further comprised of:
   an upper electrode, wherein said upper electrode faces the bottom electrode with the dielectric film interposed between the upper and bottom electrode formed from titanium nitride.

5. A semiconductor integrated circuit including a plurality of capacitive elements, each element comprising:
   a bottom electrode of polysilicon having semispherical silicon crystals formed thereon; and
   a dielectric film of laminate structure comprised of a first dielectric whose principal component is silicon nitride and a second dielectric whose principal component is tantalum pentoxide, wherein each capacitive element has a capacitance larger than 25 $fF/\mu m^2$ and said silicon nitride is formed by direct nitriding of a surface of said semispherical silicon crystals and said tantalum pentoxide is a hexagonal δ-phase crystalline.

6. The semiconductor integrated circuit as defined in claim 5, wherein the first dielectric has a film thickness larger than 1 nm.

7. The semiconductor integrated circuit as defined in claim 5, wherein the second dielectric is crystallized and the crystal has a dielectric constant higher than 50.

8. The semiconductor integrated circuit as defined in claim 5, wherein each capacitive element is further comprised of:
   an upper electrode, wherein said upper electrode faces the bottom electrode with the dielectric film interposed between the upper and bottom electrode formed from titanium nitride.

9. A semiconductor integrated circuit including a plurality of capacitive elements, each element comprised of:
   a bottom electrode of phosphorus-doped polysilicon; and
   a dielectric film of laminate structure comprised of a first dielectric whose principal component is silicon nitride and a second dielectric whose principal component is tantalum pentoxide, wherein said silicon nitride film is formed by direct nitriding of a surface of said phosphorus-doped polysilicon and said tantalum pentoxide is a hexagonal δ-phase crystalline.

10. A semiconductor integrated circuit including a plurality of each element comprised of:
    a bottom electrode of phosphorus-doped polysilicon; and
    a dielectric film of laminate structure consisting of a first dielectric whose principal component is silicon nitride and a second dielectric whose principal component is tantalum pentoxide, wherein each of said capacitive elements has a capacitance larger than 12 $fF/\mu m^2$ and said silicon nitride is formed by direct nitriding of said phosphorus-doped polysilicon and said tantalum pentoxide is a hexagonal δ-phase crystalline.

* * * * *